United States Patent [19]
Jang

[11] Patent Number: 5,366,368
[45] Date of Patent: Nov. 22, 1994

[54] MULTI-PLUNGER MANUAL TRANSFER MOLD DIE

[75] Inventor: Keun Y. Jang, Kyungsangbook-Do, Rep. of Korea

[73] Assignee: Goldstar Electron Co., Ltd., Choongchungbook-Do, Rep. of Korea

[21] Appl. No.: 960,649

[22] Filed: Oct. 14, 1992

[30] Foreign Application Priority Data

Nov. 14, 1991 [KR] Rep. of Korea ............... 19459/1991

[51] Int. Cl.$^5$ ............................................. B29L 45/00
[52] U.S. Cl. ............................... 425/544; 264/272.17; 264/328.5; 264/328.8; 425/572; 425/588; 425/127; 425/129.1
[58] Field of Search .................. 264/272.11, 272.14, 264/272.17, 328.4, 328.5, 328.8; 425/126.1, 127, 129.1, 544, 572, 588

[56] References Cited

U.S. PATENT DOCUMENTS

| | | | |
|---|---|---|---|
| 3,427,688 | 2/1969 | Wilson | 425/129.1 |
| 4,347,211 | 8/1982 | Bandoh | 425/544 |
| 4,388,265 | 6/1983 | Bandoh | 425/544 |
| 4,511,317 | 4/1985 | Bandoh | 425/544 |
| 4,580,964 | 4/1986 | Repella | 425/126.1 |
| 4,632,653 | 12/1986 | Plocher | 425/129.1 |
| 4,708,613 | 11/1987 | Sera et al. | 425/127 |
| 5,158,780 | 10/1992 | Schraven et al. | 425/588 |

FOREIGN PATENT DOCUMENTS

| | | | |
|---|---|---|---|
| 59-225913 | 12/1984 | Japan | 425/129.1 |
| 61-214439 | 9/1986 | Japan | 425/129.1 |
| 62-195135 | 8/1987 | Japan | 425/129.1 |
| 63-28616 | 2/1988 | Japan | 425/129.1 |
| 63-82717 | 4/1988 | Japan | 425/129.1 |
| 2189182 | 10/1987 | United Kingdom | 425/129.1 |

*Primary Examiner*—Charles S. Bushey
*Attorney, Agent, or Firm*—Lowe, Price, LeBlanc & Becker

[57] ABSTRACT

A preheaterless manual transfer mold die for encapsulating semiconductor elements in a process for packaging semiconductors. The preheaterless manual transfer mold die includes a multi-plunger assembly adapted for upward and downward movement to press the resin. A tablet loader is inserted into an upper mold die in order to charge tablets into plunger bushes of the upper mold die. After charging, the loader is pulled out of the upper mold die. The upper mold die receives the tablets from the tablet loader. The tablets are pressed by the multi-plungers. A lower mold die, clamped to the upper mold die, receives the resin tablets in a gel state from the upper mold die and fills cavities of chases with the resin to mold semiconductor elements.

5 Claims, 5 Drawing Sheets

MULTI-PLUNGER MANUAL TRANSFER MOLD DIE

BACKGROUND OF THE INVENTION

1. Field of the Invention

The present invention relates to a preheaterless manual transfer mold die for encapsulating semiconductor elements in a semiconductor packaging process, and more particularly to a multi-plunger manual transfer mold die which is provided with a multi-plunger assembly instead of one plunger and without a preheater so as to reduce amount of resin used in encapsulation of elements and the curing-time required to stabilize resin, thereby promoting productivity of the mold die.

2. Description of the Prior Art

Figure 1:
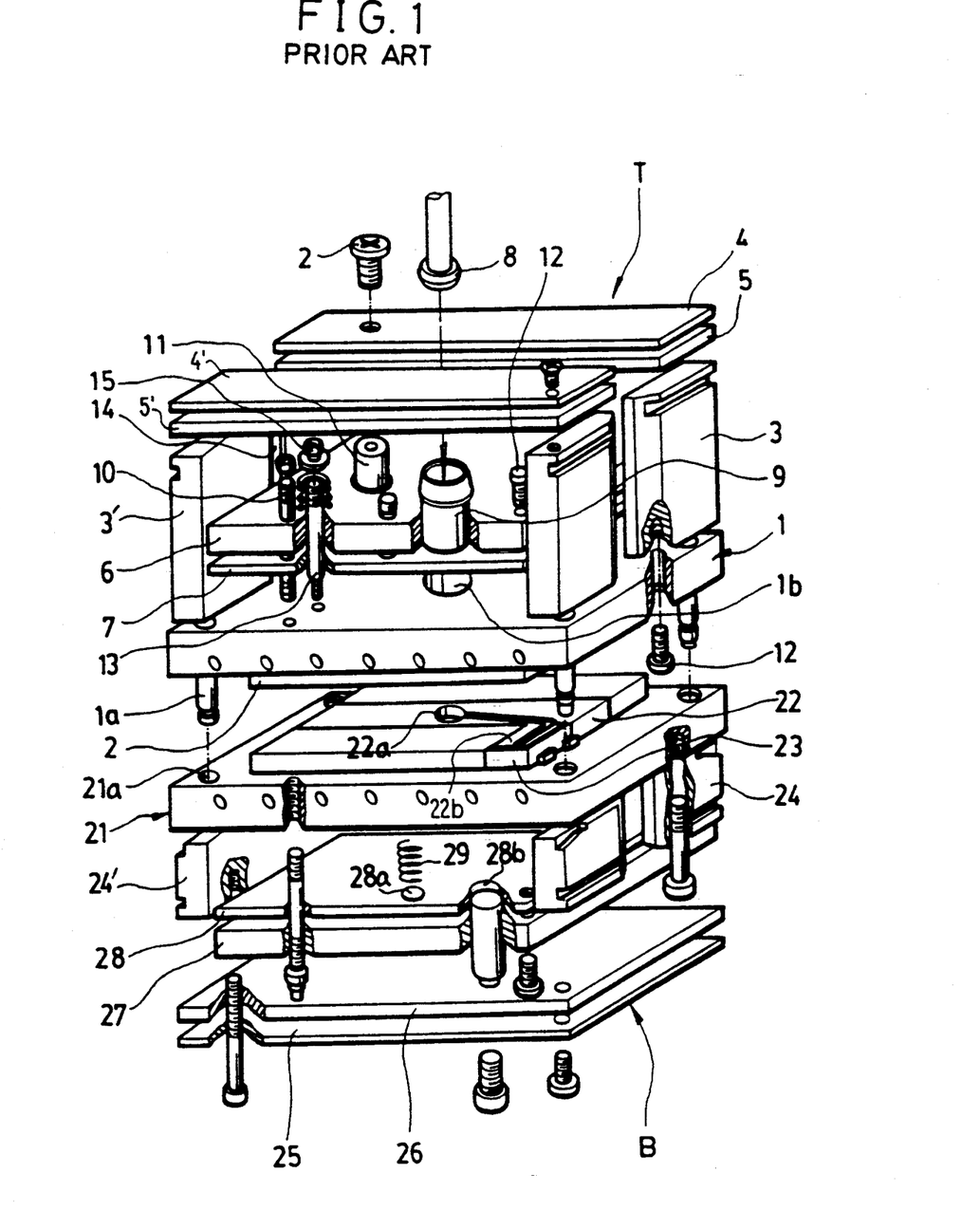
FIG. 1 is an exploded perspective view showing a known manual transfer mold die.

Referring to FIG. 1, there is shown a conventional manual transfer mold die commonly used in the molding procedure in the process for manufacturing semiconductor packages. As shown in the drawing, the manual transfer mold die may be divided into two main groups, that is, an upper mold die "T" and a lower mold die "B".

The upper mold die "T" comprises a top mold base 1 which is provided with four leader pins 1a at four corners of lower surfaces thereof and a through hole 1b at a center portion thereof, a top center block 2 having a through hole coinciding with the through hole 1b which is fixed to a lower surface of the top mold base 1, top riser blocks 3 and 3' which are divided into front parts and rear parts respectively and mounted on opposite ends of upper surface of the top mold base 1, a top ejector plate 7 interposed between the top riser block 3 and 3' and disposed on the top mold base 1, a top drive plate 6 mounted on the top ejector plate 7, a cylinder plunger bush (or pot) 9 which passes through the top drive plate 6 and the top ejector plate 7 which has an inside hole corresponding to the through hole 1b of the top mold base 1, a plunger 8 adapted to be slidably inserted in the plunger bush 9 by means of a press (not shown), a top return pin 10 fixed to an upper surface of the top mold base 1 which passes through the top drive plate 6 and the top ejector plate 7 and along which the top drive plate 6 and the top ejector plate 7 are slidable, a stud bolt 13 passing through the top drive plate 6 and the top ejector plate 7 which is provided with a spring 14 and engaged with a washer and cushion lock nut 15 at the upper end thereof, a top support pillar 11 mounted on the top drive plate 6, top insulation plates 5 and 5' which are mounted on the front parts and the rear parts of the top riser blocks 3 and 3' respectively, top clamping blocks 4 and 4' which are mounted on the top insulation plates 5 and 5' respectively, and a plurality of screws 12 for assembling the above-mentioned components.

On the other hand, the lower mold die "B" comprises a bottom mold base 21 which is formed with guide holes 21a in which the leader pins 1a formed at the top mold base 1 of the upper mold die "T" are slidably inserted, a bottom center block 22 mounted on the bottom mold base 21 which is formed with a runner 22a and gates 22b at an upper surface thereof, chases 23 which are mounted on both sides of the center block 22 and have a plurality of cavities connected to the gates 22b, bottom riser blocks 24 and 24' mounted on opposite ends of a lower surface of the bottom mold base 21 respectively, a bottom ejector plate 28 which is mounted under the bottom mold base 21 and spaced from the bottom riser block 24 and 24', a spring inserted in a hole 28a formed at an upper surface of the bottom ejector plate 28, a bottom drive plate 27 mounted under the bottom ejector plate 28, a bottom return pin 32 fixed to the bottom drive plate 27 which slideably passes through the bottom ejector plate 28 and has a stopper 33 at lower end thereof, a bottom insulation plate 26 which is mounted on lower surfaces 24 and 24' and under the bottom drive plate 27, a bottom clamp block 25 mounted under the bottom insulation plate 26, a bottom support pillar 30 fixed to the bottom drive plate 27 which is slidably inserted into a through hole 28b of the bottom ejector plate 28, and a plurality of screws for assembling the above-mentioned components.

An operation of the above known manual transfer mold die will be described as follows.

First, preheated lead frames (not shown) are placed in the cavities of the chases 23 mounted on both sides of the bottom center block 22 of the lower mold die "B". Thereafter, the upper and lower mold dies "T" and "B" are clamped by means of the top and bottom clamp blocks 4 and 25. Accordingly, the top center block 2 of the upper mold die "T" is tightly closed to the bottom center block 22 of the lower mold die "B" and the chases 23 mounted on both sides of the bottom center block 22 so that the runner 22a of the bottom center block 22, the gates 22b and the cavities of the chases 23 are sealed.

Subsequently, a massive resin tablet (not shown) is preheated by a high-frequency preheater (not shown) and then put into the plunger bush 9 of the upper mold die "T".

Then, upon pushing a switch of molding press (not shown) related to the plunger 8, the plunger 8 is lowered through the plunger bush 9 so that the resin tablet in the plunger bush 9 is injected into the runner 22a of the bottom center block 22 through the through hole 1b of the top mold base 1. At this time, since the resin tablet is normally preheated to a temperature of 85°–95° C. and the mold die is heated to a temperature of 175°±5° C., the resin tablet changes into gel and is injected into the runner 22a. The resin tablet in a gel state is injected into the chases 23 through the gates 22b to fill the cavities of the chases 23.

When the cavities in the chases 23 are completely filled with the resin, the downward movement of the plunger 8 is stopped but the pressurization of the plunger 8 is continuously maintained. Upon being pressurized, the resin is cured. Although the curing time required to cure resin is variable according to desired products, it generally requires a time of 200–300 seconds to cure resin.

When the resin is completely cured, the plunger 8 is raised by the molding press. Thereafter, as the upper mold die "T" is separated from the lower mold die "B", the molded products are raised from the chases 23 by a push pin (not shown) to be removed.

However, when the above-mentioned known manual transfer mold die has a large number of cavities in the chases 23 (for example, the mold die has generally 40–660 cavities), it requires a large amount of resin to mold. Accordingly, resin tablets become large in size because there are only one plunger 8 and one plunger bush 9.

Hence, resin tablets must be put in the plunger bush 9 after being preheated in order to change the resin tablet into gel. Therefore, a preheater must be used in order to preheat the resin tablets, thereby increasing consumption of electric power and necessitating additional space to establish the preheater.

In addition, since resin must be filled in a plurality of cavities through only one runner 22a and then stabilized, it takes a long curing time to stabilize the resin. Also, since the resin tablet must be put in only one plunger bush 9, a large amount of resin tablet must be consumed, thereby decreasing productivity.

Furthermore, since large air gaps are formed between the plunger bush 9 and resin tablet, defects such as foam and porosity and wire sweeping may occur.

SUMMARY OF THE INVENTION

The present invention has been made in view of the above-described problems occurring in the prior art and an object of the invention is to provide a multi-plunger manual transfer mold die which has a multi-plunger assembly so as to lessen amount of resin to be put in the plunger bushes, thereby causing the curing time to be shortened and productivity of semiconductor package molding processes to be improved.

Another important object of the invention is a multi-plunger manual transfer mold die which can carry out a molding process without preheating the tablets by incorporating a multi-plunger system.

In accordance with the present invention, the objects mentioned above can be accomplished by providing a multi-plunger manual transfer mold die which presses resin tablets charged in an upper mold die by means of multi- plungers so that the resin is injected into cavities of chases of a lower mold die to mold objects in the cavities. The multi-plunger manual transfer mold die includes: a multi-plunger assembly having a plurality of plungers which are adapted to be moved upward and downward by a press so as to press resin; a tablet loader having a plurality of tablet charging gates which is inserted in an upper mold die to charge tablets in the tablet charging gates into a plurality of plunger bushes of the upper mold die. The upper mold die also includes a top mold base and a top center block mounted on a lower surface of the top mold base which have a plurality of through holes corresponding to the plungers which pass therethrough, a first top riser block being divided into a front part and a rear part which are fixed to an end of an upper surface of the top mold base and a second top riser block being an integral part which is fixed to the other end of the upper surface of the top mold base, front and rear top ejector plates mounted between the first and second top riser blocks, front and rear top drive plates mounted on the front and rear ejector plates respectively which have, at facing surfaces thereof, guide rails for guiding insertion an secession of the tablet loader, a front top clamp block mounted on the first top riser block and the front part of second top riser block at opposite ends thereof and a rear top clamp block mounted on the first top riser block and the rear part of second top riser block at opposite ends thereof, and front and rear top insulation plates mounted on the front and rear top clamp blocks respectively; a lower mold die including a lower mold base formed with guide holes for guiding the upper mold die which is to be clamped to the lower mold die, a bottom center block mounted on the lower mold base which is formed at an upper surface thereof with a plurality of runners being in communication with each other by gate grooves, chases mounted on both sides of the bottom center block which have a plurality of cavities being in communication with the gate grooves, bottom riser blocks mounted on opposite ends of a lower surface of the bottom mold base, a bottom ejector plate and a bottom drive plate disposed between the bottom riser blocks, and a bottom clamp block and a bottom insulation block mounted on lower surfaces of the bottom riser blocks.

In operation of the multi-plunger manual transfer mold die according to the invention, the upper mold is first clamped to the lower mold die. The tablet loader containing tablets is inserted into the upper mold die along the guide rails to charge the tablets into the through holes of the top mold base and then pulled out of the upper mold die. Thereafter, upon operating the press, the multi-plungers press the tablets introduced in the through holes of the top mold base. Accordingly, the tablets change into gel and are injected into the runners of the bottom center block of the lower mold die. The resin in gel state fills in the cavities of the chases through the gate grooves. Subsequently, the resin in the cavities is cured by pressurization of the multi-plungers for a certain duration, thereby completing the molding process.

Therefore, since a plurality of small sized tablets are simultaneously charged into the upper mold die and then injected into the cavities through a plurality of runners, there is no need to preheat the tablets and the time required to cure the resin is shortened.

BRIEF DESCRIPTION OF THE DRAWINGS

These and other objects, features and advantages of the invention will become more apparent upon a reading of the following detailed specification and drawings, in which.

DETAILED DESCRIPTION OF THE PREFERRED EMBODIMENTS

A multi-plunger manual transfer mold die according to the present invention will now be described by referring to FIGS. 2 to 7 in the accompanying drawings.

Figure 2:
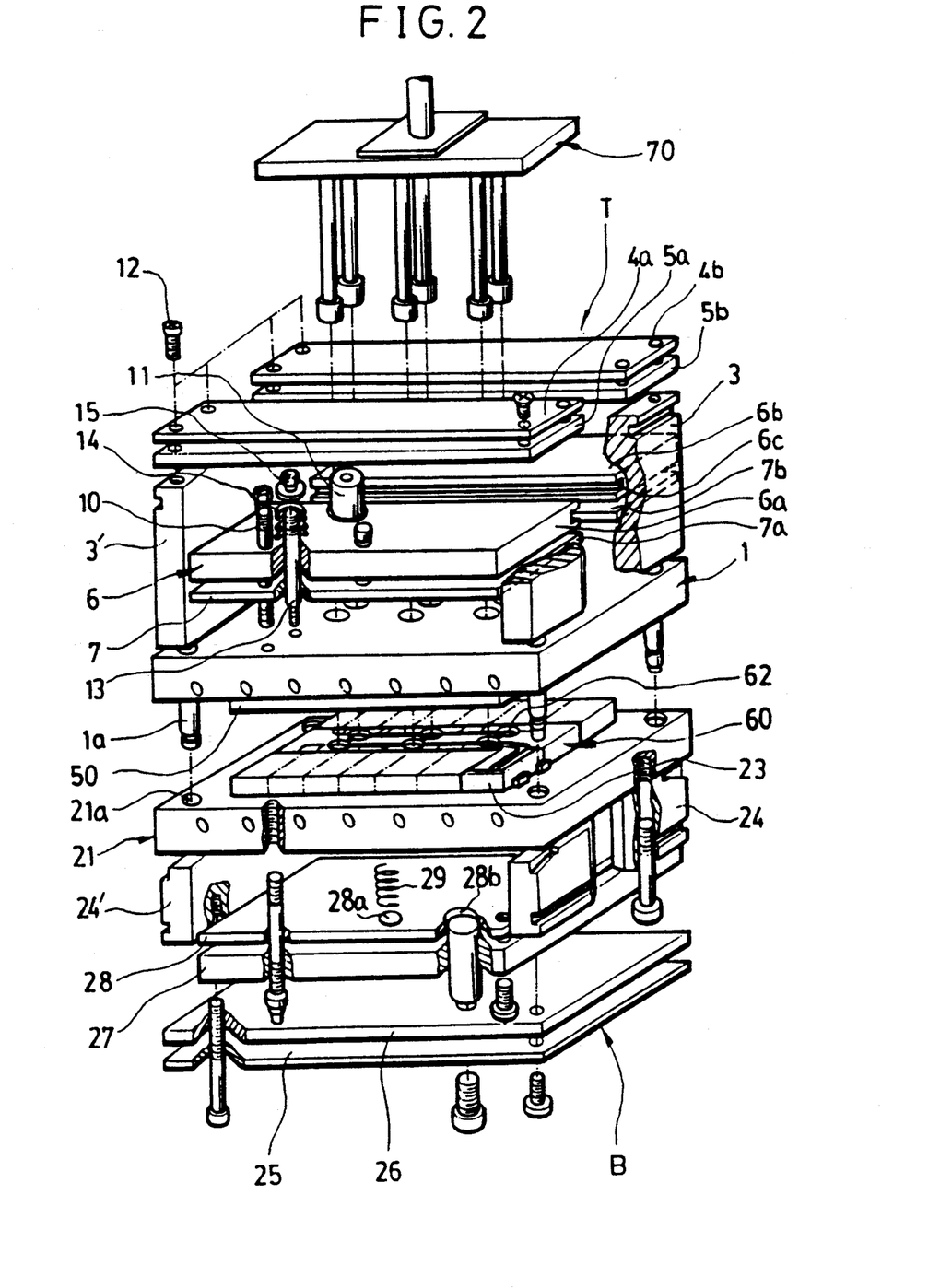
FIG. 2 is an exploded perspective view showing a multi-plunger manual transfer mold die according to the present invention.

Referring to FIG. 2, there is shown a multi-plunger manual transfer mold die according to the invention which is in exploded view. As shown in the drawing, the multi-plunger manual transfer mold die comprises a multi-plunger assembly 70 having a plurality of plungers, an upper mold die "T" which is adapted to receive a plurality of tablets which are simultaneously pressed by the plungers of the multi-plunger assembly, a lower mold die "B", formed with runners corresponding to the plungers, to which resin is introduced from the upper mold die "T" to mold objects in the cavities thereof, and a tablet loader 40 for charging a plurality of tablets into the upper mold die "T".

In the upper mold die "T", a top center block 50 is welded to a lower surface of a top mold base 1 and leader pins 1a are fixed to four corners of a lower surface of the top mold base 1. The top mold base 1 and the top center block 50 are formed with through holes corresponding to the plungers and plunger bushes are inserted in the through holes respectively.

A top riser block 3 is divided into a front part and a rear part and fixed to an end of an upper surface of the top mold base 1 and another integral top riser block 3' is fixed to the other end of the top mold base 1.

A top ejector plate 7 and a top drive plate 6 are mounted on the top mold base 1 and between the top riser blocks 3 and 3' which are upward and downward movable along a top return pin 10 and a top stud bolt 13. The top drive plate 6 is divided into a front top drive plate 6a and a rear top drive plate 6b and the top ejector plate 7 is divided into a front top ejector plate 7a and a rear top ejector plate 7b, respectively.

The front and rear top drive plates 6a and 6b are formed with inner facing side surfaces thereof having guide rails 6c for guiding insertion/secession of the tablet loader 40. Top clamp blocks 4a and 4b and top insulation plates 5a and 5b are divided into front parts 4a and 5a and rear parts 4b and 5b respectively and mounted on the top riser blocks 3 and 3'.

Figures 6, 7:
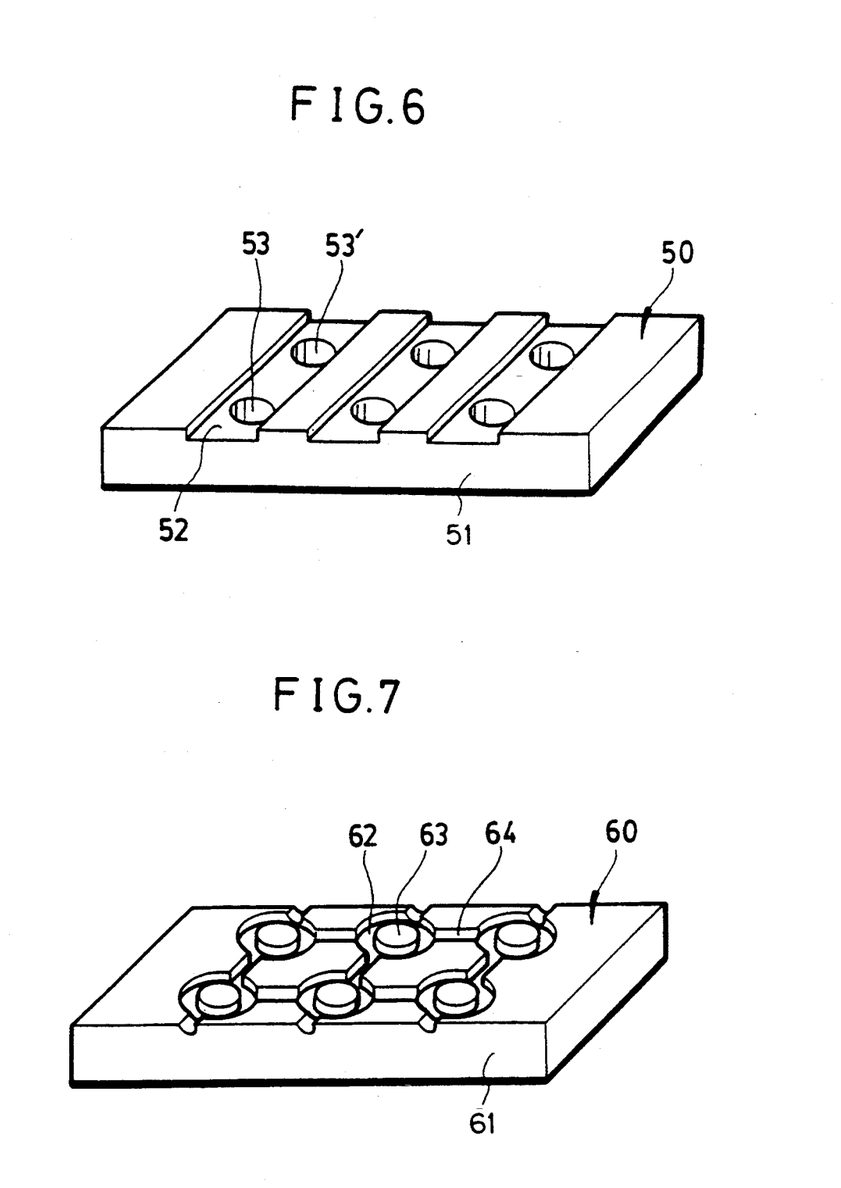
FIG. 6 is a perspective view showing a top center block according to the invention.
FIG. 7 is a perspective view showing a bottom center block according to the invention.

On the other hand, in the lower mold die "B", guide holes 21a are formed at four corners of a lower mold base 21 to guide the reader pins 1a fixed to the top mold base 1 of the upper mold die "T" and a bottom center block 60 having a plurality of runners corresponding to the plungers is welded to an upper surface of the lower mold base 21, the runners being connected to each other by gate grooves 64 (see FIG. 7). Chases having a plurality of cavities connected to the gate grooves 64 are mounted on both sides of the bottom center block 60.

Under the bottom mold base 21 is mounted bottom riser blocks 24 and 24', a bottom ejector plate 28, a bottom drive plate 27, a bottom clamp block 26 and a bottom insulation block 25.

Figure 3:
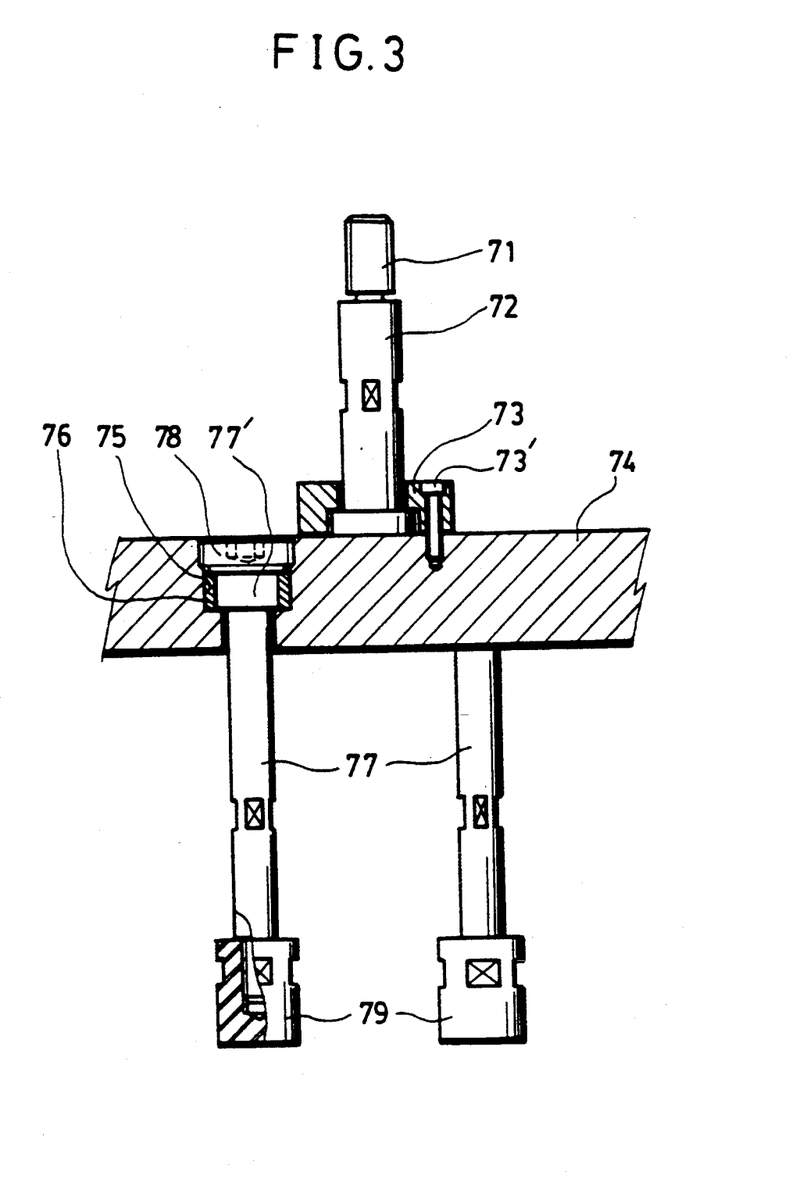
FIG. 3 is the vertical sectional view of a multi-plunger assembly in FIG. 2.

Referring to FIG. 3, there is shown a section of a multi-plunger assembly according to the invention. The multi-plunger assembly 70 comprises a retainer 74 fixed to a lower end of a connecting rod 72 integrally formed with a press cylinder rod 71, a plurality of plunger rods 77 protruding downward from the retainer 74, and plunger tips 79 welded to ends of the plunger rods 77.

The connecting rod 72 is formed with a flange at a lower end thereof. A connector 73 is inserted on the connecting rod 72 and mounted on the flange of the connecting rod 72. The connector 73 is coupled to the retainer 74 by means of screws 73' so that the connecting rod 72 is fixedly mounted on the retainer 74.

The retainer 74 is formed with a plurality of holes 75, each of the holes having an enlarged step portion. A guide bush 76 is mounted in each of holes 75 and placed on the step portion. The plunger rods 77 are inserted in the holes 75 through the guide bush 76 such that heads of the plunger rods 77 are placed on the step portions. The holes 75 are formed with threaded portions at upper ends thereof and the threaded portions are engaged with fixing nuts.

Figure 4:
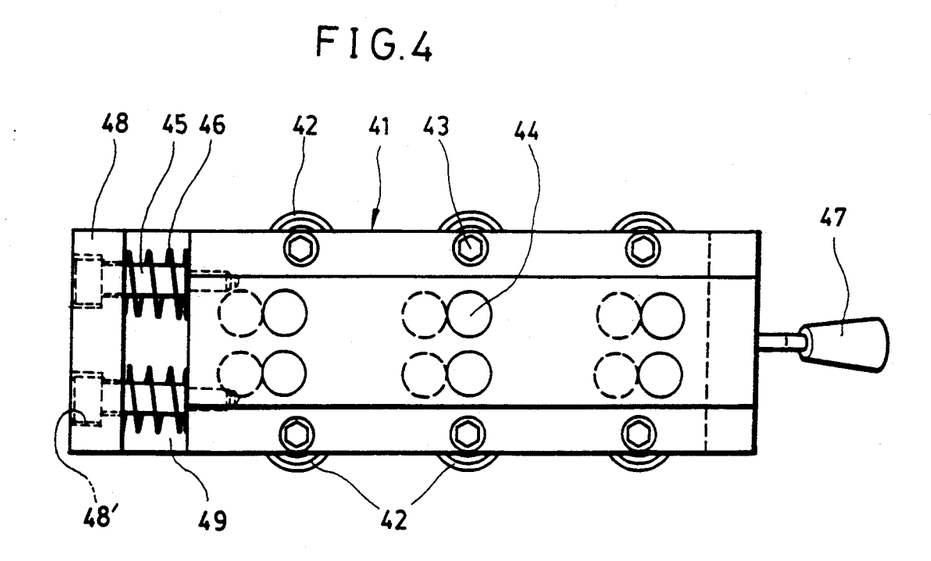
FIG. 4 is a top plan view showing a tablet loader according to the invention.
Figure 5:
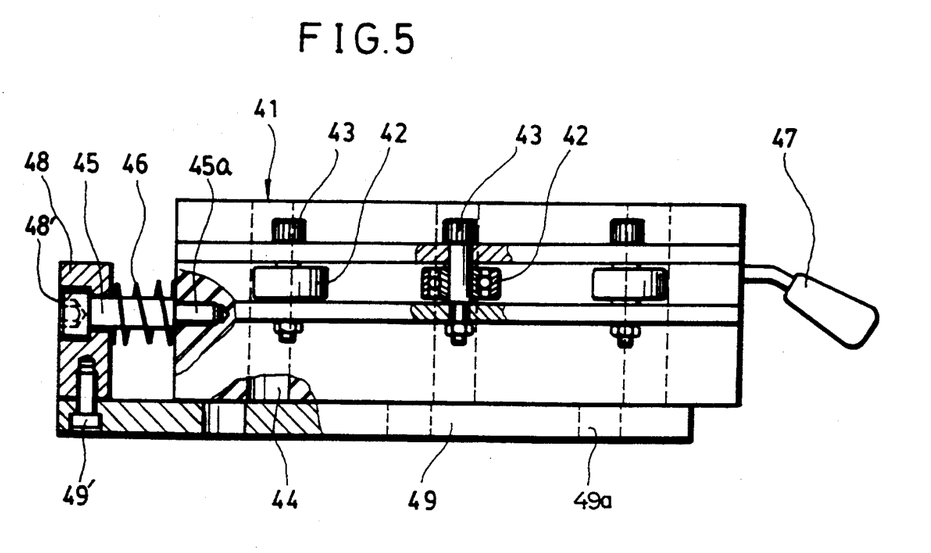
FIG. 5 is a vertical sectional view of the tablet loader in FIG. 4.

Referring to FIGS. 4 and 5, there are shown a tablet loader according to the invention. As shown in the drawings, the tablet loader 40 comprises a loader body 41 having a plurality of tablet charging gates 44 and having a plurality of guide bearing 42 rotatably mounted on both sides of the loader body 41 by shoulder screws 43 which are to be inserted into the guide rails 6c formed at the upper mold die "T", a boss support 48 having supporting holes 48', each of the supporting holes 48' having an enlarged step portion, bosses 45 which are mounted in the supporting holes 48' at head ends thereof and engaged with an end of the loader body 41 at threaded ends 45a thereof, springs 46 which are interposed between the boss support 48 and the loader body 41 and inserted on the bosses 45 to bias the loader body 41 rightward in the drawings, a slide cover 49 which is connected to the boss support 48 by a plurality of screws 49' and has holes 49a corresponding to the tablet charging gates 44, and a handle 47 fixed to the other end of the loader body 41 which is adapted to insert the tablet loader 40 into the upper mold die "T" and pull the tablet loader out of the upper mold die.

Referring to FIG. 6, there is shown a top center block according to the invention. The top center block 50 comprises a block body 51, a plurality of slots 52 formed at the upper surface of the block body 51, and a plurality of through holes 53 and 53' formed at the slots 52 which correspond to the plungers 77. Plunger bushes (not shown) are inserted into the through holes 53 and 53'. Flanges of the plunger bushes are placed on the slots 52 so that the plunger bushes are maintained in the through holes 53 and 53'. Although the slots 52 may be formed into a circular shape, the slots 52 shown in the drawing are formed into a shape which can be machined easily.

Referring to FIG. 7, there is shown a bottom center block according to the invention. The surface of block body 61, of the top center block 60, which is to be close to a lower surface of the top center block 50, is formed with a plurality of circular grooves or runners 62. The runners 62 are in communication with each other by means of gate grooves 64. The runners 62 are provided with protrusions 63 having diameters smaller than those of the runners 62, respectively. The protrusions 63 have been generally used in order to reduce consumption of resin.

Operation of the multi-plunger manual transfer mold die according to the present invention will be described hereinafter.

First, desired objects to be molded (for example, a semiconductor chip connected to a lead frame) are put in the chases 23 of the lower mold die "B" separated from the upper mold die "T". In this case, a plurality of preheated lead frames are mounted on a loading fixture and put in the chases 23 so that the lead frames are precisely disposed by location pins of the chases 23 (not shown, usually 3EA/FRAME), respectively.

Thereafter, the upper mold die "T" is clamped to the lower mold die "B". Certain sized tablets are put in the tablet charging gates 44 of the tablet loader 40 respectively. The tablet loader 40 containing the tablets is pushed into the upper mold die "T" along the guide rails 6c of the top drive plates 6a and 6b. After the tablet loader 40 has been pushed completely and stopped at a certain position, upon further pushing of the handle 47 of the tablet loader 40, the tablet loader body 41 is moved toward the boss support 48 against the springs 46. As the tablet loader body 41 is moved to the boss support 48, the tablet charging gates 44 of the loader body 41 coincide with holes 49a of the slide cover 49. At this time, the tablets contained in the tablet charging gates 44 are dropped into the through holes of the top mold base 1. That is, the slide cover 49 functions as a shutter for tablet.

After the tablets have been dropped, the tablet loader 40 is manually pulled out of the upper mold die by an operator. Then, upon operating a press, the multi-plunger assembly 70 is lowered so that the plunger tips 79 welded to ends of the plunger rods 77 are inserted into the through holes of the top mold base 1 to press the tablets.

At this time, since the upper mold die was previously heated to a temperature of about 175° C., the relative small mass of the tablets contained in the through holes of the top mold base 1 change into gel and are injected into the runners 64 of the bottom center block 60 of the lower mold die "B".

On the other hand, since a prior manual transfer mold die uses a relatively large massive tablet (for example, having a diameter in a range of 48-58 mm) and only one plunger, the tablet must be previously preheated to change into gel. However, since the multi-plunger manual transfer mold die according to the invention presses a plurality of tablets by a plurality of plungers, tablets can be divided into relative small mass tablets (for example, having a diameter of 24 mm) and charged into the mold die. Therefore, the tablets can change easily into gel with the mold die preheated to a temperature of 175° C. and without procedure for preheating tablets.

As the multi-plungers are further lowered, the resin in a gel state fills the cavities of the chases 23 through the gate grooves 64. When the plungers are lowered such that the resin is bulged to a height of 2-3 mm above the runners 62, the resin is completely filling the cavities and descent of the plungers is stopped but pressurization of the plungers is maintained for a certain duration.

In this case, it is important to reduce the amount of resin remaining in the runners 62 and the gate grooves 64, namely to reduce consumption of resin. Since total volume of the runners according to the invention is smaller than that of the prior runner, it is possible to reduce consumption of resin as compared with the prior art. For a better understanding of the present invention, lead frames having 14/16 leads were molded by the mold die according to the invention and a prior mold die, both having 168 cavities. The mold die according to the invention consumed 192 g of resin but the prior mold die consumed 240 g of resin. Accordingly, the multi-plunger manual transfer mold die according to the invention can reduce consumption of resin by 10% compared with a prior mold die.

While the above-mentioned pressurization of the plungers is continuously maintained, the resin is cured. Although a time required to cure resin may vary according to desired products, the mold die according to the invention commonly requires a time of 60-100 sec to cure resin. Therefore, the curing time required in the mold die according to the invention is substantially shortened as compared with a prior mold die.

Thereafter, when curing of the resin is completed, the multi-plunger assembly 30 is raised and then the upper mold die "T" is separated from the lower mold die "B". Then, the molded products (for example, semiconductor packages) are lifted out of the cavities by push pins in the chases 23 and removed by an operator.

As apparent from the above description of the invention, since the multi-plunger manual transfer mold die uses small diameter of tablets differently from a prior art, there is no necessity for preheating tablets in order to change the tablets into gel.

Furthermore, since a preheater is not necessary for preheating, it is possible to reduce the waste of electric power and space occupied by the molding system.

Also, since air gaps between the plunger bushes and tablets are small because the diameter of the plunger bushes is smaller than the diameter of the prior plunger bush, foam, porosity and wire sweeping are considerably reduced and also the waste of resin is reduced.

Finally, since resin is filled in the cavities through a plurality of runners and then cured, the time required to cure the resin is shortened, thereby improving productivity.

Although the preferred embodiments of the invention have been disclosed for illustrative purpose, those skilled in the art will appreciate that various modifications, additions and substitutions are possible, without departing from the scope and spirit of the invention as disclosed in the accompanying claims.

What is claimed is:

1. A multi-plunger manual transfer mold die comprising:

a multi-plunger assembly, having a plurality of plungers, which is lowered and raised by a press so as to press resin tablets;

a tablet loader for containing a plurality of tablets which is inserted in an upper mold die to charge the tablets into a plurality of plunger bushes of the upper mold die and then pulled out of the upper mold die;

the upper mold die including means to receive the tablet loader and to receive the tablets from the tablet loader so that the tablets can be pressed by the plungers; and a lower mold die which is to be clamped to the upper mold die and then receives in cavities of chases thereof the resin from the upper mold die to mold half-finished products mounted in the chases;

wherein said multi-plunger assembly includes a retainer fixed to an end of a connecting rod integrally formed with a press cylinder rod, a plurality of plunger rods downwardly projected from the retainer, and a plurality of plunger tips each welded to each of ends of the plunger rods;

wherein said connecting rod is provided with a flange at a lower end thereof, a connector is inserted on the connecting rod and mounted on the flange, and screws are engaged with the retainer through holes formed at the connector, thereby causing the connecting rod to be coupled to the retainer; and wherein said retainer is formed with a plurality of holes each having an enlarged step portion and an upper threaded portion, bushes are mounted in the enlarged portions of the holes respectively, each of the plunger rods is inserted in the bush at a head end thereof, and each of the upper threaded portions of the holes is engaged with a fixing nut, thereby causing the plunger rods to be coupled to the retainer.

2. A multi-plunger manual transfer mold die comprising:

a multi-plunger assembly, having a plurality of plungers, which is lowered and raised by a press so as to press resin tablets;

a tablet loader for containing a plurality of tablets which is inserted in an upper mold die to charge the tablets into a plurality of plunger bushes of the upper mold die and then pulled out of the upper mold die;

the upper mold die including means to receive the tablet loader and to receive the tablets from the tablet loader so that the tablets can be pressed by the plungers; and a lower mold die which is to be clamped to the upper mold die and then receives in cavities of chases thereof the resin from the upper mold die to mold half-finished products mounted in the chases;

wherein said tablet loader comprises:

a loader body formed with a plurality of tablet charging gates corresponding to the plunder rods, a plurality of guide bearings rotatably mounted on opposite sides of the loader body by shoulder screws which are inserted in guide rails of the upper mold die, a slide cover formed with holes corresponding to the tablet charging gates of the loader body on which the loader body slides, a boss support fixed to an end of the slide cover which is formed with supporting holes each having an enlarged step portion, bosses which are mounted in the enlarged step portions of the boss support at a head ends thereof and engaged with the loader body at a threaded end thereof, springs inserted on the bosses and interposed between the boss support and the loader body to bias the loader body, and a handle fixed to another end of the loader body for inserting the tablet loader into the upper mold die and pull the tablet loader out of the upper mold die.

3. A multi-plunger manual transfer mold die comprising:

a multi-plunger assembly, having a plurality of plungers, which is lowered and raised by a press so as to press resin tablets;

a tablet loader for containing a plurality of tablets which is inserted in an upper mold die to charge the tablets into a plurality of plunger bushes of the upper mold die and then pulled out of the upper mold die;

the upper mold die including means to receive the tablet loader and to receive the tablets from the tablet loader so that the tablets can be pressed by the plungers; and a lower mold die which is to be clamped to the upper mold die and then receives in cavities of chases thereof the resin from the upper mold die to mold half-finished products mounted in the chases;

wherein said upper mold die comprises:

a top mold base provided with a top center block at a lower surface thereof, the top mold base being formed with a plurality of through holes corresponding to the plungers therethrough and downward extending leader pins at corners of a lower surface thereof, a first top riser block and a second top riser block, the first top riser block being divided into a front part and a rear part which are fixed to an end of an upper surface of the top mold base and the second top riser block being an integral part which is fixed to the other end of the upper surface of the top mold base, front and rear top ejector plates which are mounted between the first and second top riser blocks and moveable towards or away from the top mold base along a top return pin and a top stud bolt fixed to the top mold base, front and rear top drive plates which are mounted on the front and rear to ejector plates respectively and moveable towards or away from the top mold base along the top return pin and the top stud bolt fixed to the top mold base, the front and rear top drive plates being formed at facing surfaces thereof with guide rails for guiding movement of the tablet loader, front and rear top clamp blocks, the front top clamp block being mounted on the first top riser block and the front part of second top riser block at opposite ends thereof and the rear top clamp block being mounted on the first top riser block and the rear part of second top riser block at opposite ends thereof; and front and rear top insulation plates which are mounted on the front and rear top clamp blocks respectively; and wherein said top center block is formed with a plurality of slots at an upper surface thereof and with a plurality of through holes formed at the slots coinciding with the through holes at the top mold base.

4. A multi-plunger manual transfer mold die comprising:

a multi-plunger assembly, having a plurality of plungers, which is lowered and raised by a press so as to press resin tablets;

a tablet loader for containing a plurality of tablets which is inserted in an upper mold die to charge the tablets into a plurality of plunger bushes of the upper mold die and then pulled out of the upper mold die;

the upper mold die including means to receive the tablet loader and to receive the tablets from the tablet loader so that the tablets can be pressed by the plungers; and a lower mold die which is to be clamped to the upper mold die and then receives in cavities of chases thereof the resin from the upper mold die to mold half-finished products mounted in the chases;

wherein said lower mold die comprises:

a lower mold base formed with guide holes for guiding the leader pins of the upper mold die, wherein said lower mold base is clamped to the upper mold die, a bottom center block mounted on the lower mold base which is formed at an upper surface thereof with a plurality of runners corresponding to the plungers, the runners being in communication with each other by gate grooves, chases mounted on both sides of the bottom center block which have a plurality of cavities being in communication with the gate grooves, bottom riser blocks mounted on opposite ends of a lower surface of the bottom mold base, a bottom ejector plate and a bottom drive plate disposed between the bottom riser blocks, and a bottom clamp block and a bottom insulation block mounted on lower surfaces of the bottom riser blocks.

5. A multi-plunger manual transfer mold die according to claim 4, wherein said bottom center block comprises:

the plurality of runners formed at the upper surface of the bottom center block which corresponds to the plungers;

the gate grooves being in communication with the runners and the chases through which resin introduced in the runners is injected into the chases; and protrusions provided in the runners each of which has a diameter smaller than that of the runner.

* * * * *